United States Patent [19]

Kuwabara

[11] Patent Number: 5,894,249

[45] Date of Patent: Apr. 13, 1999

[54] DIGITAL AND ANALOG MODULATOR IN A SIMPLIFIED CIRCUIT STRUCTURE

[75] Inventor: Keiichi Kuwabara, Tokyo, Japan

[73] Assignee: NEC Corporation, Tokyo, Japan

[21] Appl. No.: 08/782,538

[22] Filed: Jan. 10, 1997

[30] Foreign Application Priority Data

Jan. 12, 1996 [JP] Japan ..................... 8-003627

[51] Int. Cl.⁶ ........................................ H03C 3/00
[52] U.S. Cl. ................ 332/103; 332/119; 332/151; 327/254; 455/102; 455/313
[58] Field of Search ................ 332/103–105, 332/108, 119–120, 151–152, 100–102; 455/102, 313; 327/238, 254, 255

[56] References Cited

U.S. PATENT DOCUMENTS

| 4,843,351 | 6/1989 | Edwards et al. .............. 332/103 |
| 5,224,119 | 6/1993 | Barabash et al. ............ 455/102 X |
| 5,319,675 | 6/1994 | Osaka ............................ 375/59 |

FOREIGN PATENT DOCUMENTS

| 0 595 781 A2 | 5/1994 | European Pat. Off. . |
| 0 621 683 A2 | 10/1994 | European Pat. Off. . |
| 61-263302 | 11/1986 | Japan . |
| 5-90841 | 4/1993 | Japan . |
| 5-122088 | 5/1993 | Japan . |
| 6-188751 | 7/1994 | Japan . |
| 8-139618 | 5/1996 | Japan . |

*Primary Examiner*—David Mis
*Attorney, Agent, or Firm*—Scully, Scott, Murphy & Presser

[57] ABSTRACT

A digital and analog modulator is configured in a simplified circuit structure. The modulator includes a first frequency mixer circuit for modulating a carrier with an analog signal or a sine wave component of a digital signal, a second frequency mixer circuit for modulating a signal attained by shifting a phase of the carrier with an analog signal or a cosine wave component of the digital signal, and an adder for adding signals from the first and second frequency mixer circuits to each other.

5 Claims, 4 Drawing Sheets

F I G. 4
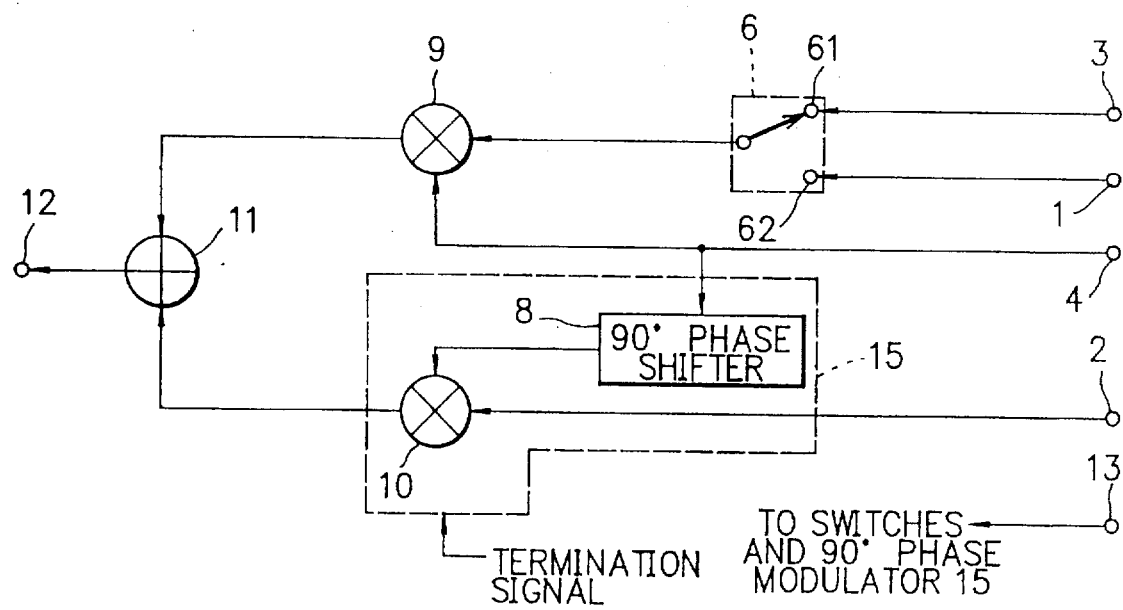

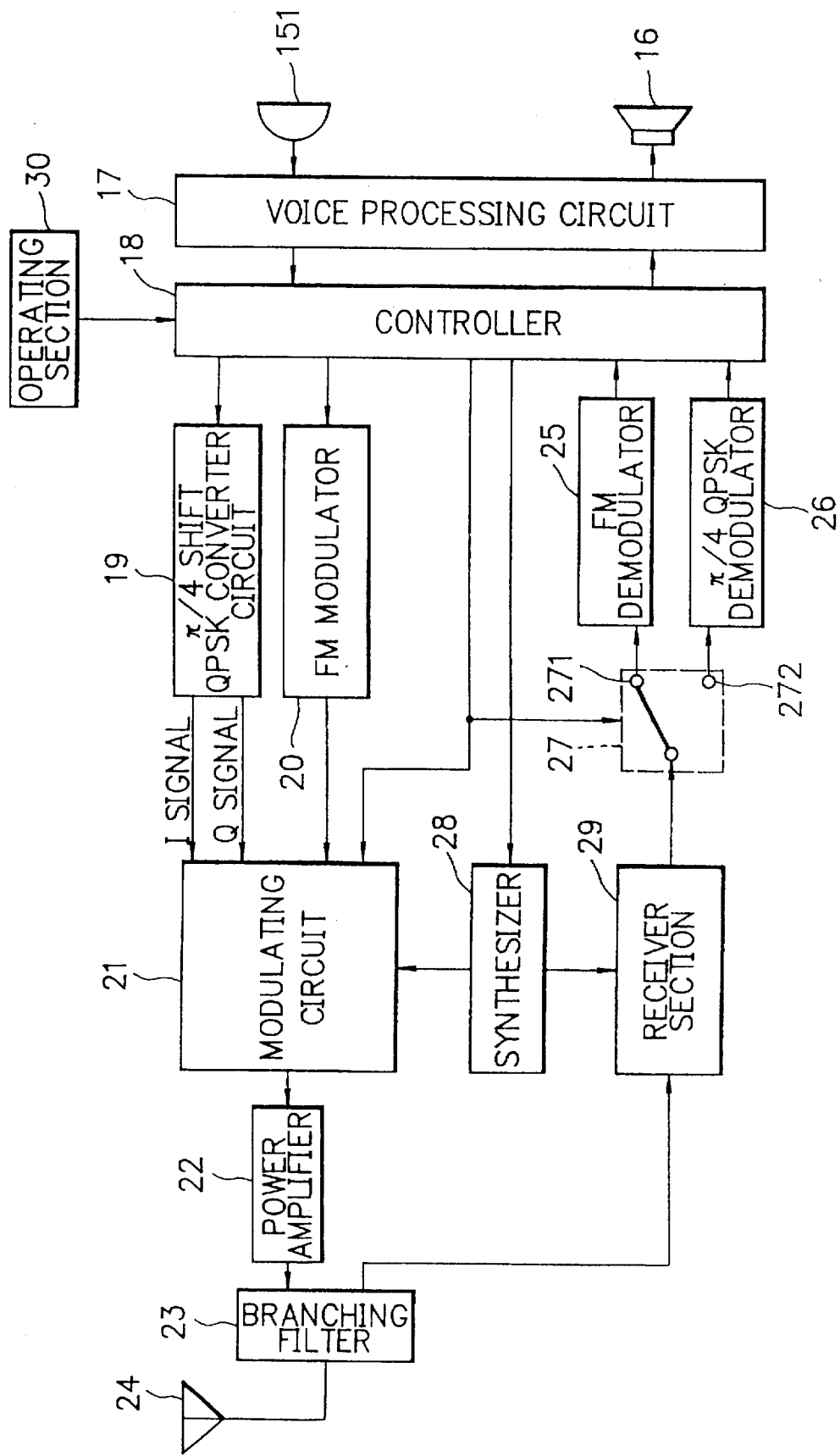

DIGITAL AND ANALOG MODULATOR IN A SIMPLIFIED CIRCUIT STRUCTURE

BACKGROUND OF THE INVENTION

The present invention relates to a modulator, and in particular, to a digital and analog modulator for modulating digital and analog signals.

DESCRIPTION OF THE PRIOR ART

In operation of digital and analog orthogonal modulators of this kind, digital and analog signals are conventionally transmitted through one orthogonal modulator as described, for example, in the Japanese Patent Laid-Open Publication No. 61-263302.

FIG. 1 shows in a block circuit diagram a digital and analog orthogonal modulator (to be simply referred to as a modulator herebelow) of the Japanese Patent Laid-Open Publication No. 61-263302.

The modulator of FIG. 1 includes a digital signal input terminal 31, an analog signal input terminal 32, a waveform generator circuit 33, a sign decision circuit 34, and a data switching circuit 35. Furthermore, the modulator includes an integrating cycle controller circuit 39, an internal clock oscillator 37, an integrating circuit 38, a complex envelope generator circuit 39, an orthogonal modulating circuit 40, a carrier oscillator circuit 41, an output terminal 42, and a switching unit 43.

The integrating cycle controller 36 includes an absolute value generator circuit 361 and a voltage/frequency converter 362, whereas the orthogonal modulating circuit 40 includes frequency mixer circuits 401 and 403, a 90° phase shifter circuit 402, and an adder 404. The switch section 43 includes terminals 431 and 432.

When the modulator is adopted to send digital signals (in a digital mode), a digital signal is supplied via the digital signal input terminal 31 to the waveform generator 33. In the generator 33, a high-frequency component of the input signal is removed and resultantly obtained instantaneous phase data is outputted to the data switching circuit 35. The data is then transmitted via the data switching circuit 35 to the integrating circuit 38.

In the digital mode, the switch 43 selects the terminal 431. Therefore, the internal clock oscillator 37 supplies an internal clock signal via the switch 43 to the integrating circuit 38.

The instantaneous phase data from the waveform generator 33 is integrated in association with the internal clock signal having a cycle of τ generated from the internal clock oscillator 37. As a result, instantaneous phase data of the digital frequency-modulated wave is sent to the complex envelope generator 39. In the generator 39, the instantaneous phase data is converted into a sine wave signal (to be referred to as an I signal herebelow) and a cosine wave signal (to be referred to as a Q signal herebelow), which are then delivered to the frequency mixers 401, and 403, respectively. In the mixer 401, the I signal is used to modulate a carrier from the carrier oscillator 41 such that a modulated wave signal of the I signal is fed to the adder 404.

In the mixer 403, the Q signal is used to modify a carrier from the phase shifter 402, the carrier being obtained by shifting 90° a phase of the carrier from the carrier oscillator 41. Resultantly, a modulated wave signal of the Q signal is outputted to the adder 404. In the adder 404, the modulated wave signals respectively of the I and Q signals are added to each other to produce a resultant modulated wave signal.

Finally, the modulated wave signal is delivered from the output terminal 402.

On the other hand, when the modulator operates in an analog mode, an analog signal is supplied via the analog signal input terminal 32 to the sign decision circuit 34. If the signal has a positive sign a constant of c is delivered via the data switching circuit 35 to the integrating circuit 38. If the signal is negative, a constant −c is similarly fed to the integrator 38.

Additionally, the analog signal from the analog input terminal 32 is delivered to the integrating cycle controller 36. In the absolute value generator 361 of the controller 36, the analog signal is processed so as to obtain an absolute value of amplitude thereof. The attained absolute value signal is thereafter outputted to the voltage/frequency converter 362. In the converter 362, the absolute value signal is transformed into a frequency proportional to the absolute value indicated by the absolute value signal. The resultant frequency signal having a frequency of f is delivered to the switch unit 43. In the analog mode, the switch circuit 432 selects the terminal 432 and hence the frequency signal generated from the converter 362 is fed to the integrating circuit 38.

In the integrator 38, the constant c or −c from the sign decision circuit 34 is utilized to integrate a reciprocal, i.e., 1/f of the frequency f of the frequency signal from the voltage/frequency converter 362 such that instantaneous phase data of the analog frequency-modulated wave signal is outputted to the complex envelope generator 39.

In the generator 39, the instantaneous phase data is transformed into an I signal and a Q signal to be respectively fed to the frequency mixers 401 and 403.

In the mixer 401, the I signal is adopted to modify a carrier from the carrier oscillator 41 so as to deliver a resultant modulated wave signal of the I signal to the adder 404. In the mixer 403, the Q signal is utilized to modify a carrier from the phase shifter 402, the carrier being attained by shifting 90° a phase of the carrier from the carrier oscillator 41. As a result, a modulated wave signal of the Q signal is sent to the adder 404. In the adder 404, the modulated wave signals respectively of the I and Q signals are added to each other such that a resultant modulated wave signal is delivered from the output terminal 402.

However, the digital and analog modulator of the prior art requires a voltage/frequency converter to produce a frequency in proportion to amplitude of an analog signal inputted thereto and an integrating circuit to generate instantaneous phase data of a digital signal or an analog signal supplied thereto. This disadvantageously leads to a problem that the production cost of the digital and analog modulator is soared and the circuit structure thereof is complex.

SUMMARY OF THE INVENTION

It is therefore an object of the present invention to provide a digital and analog modulator configured in a simplified circuit structure, thereby solving the problem above.

In accordance with the present invention, there is provided a digital and analog modulator including a first frequency mixer circuit for modulating a carrier according to an analog signal or a sine wave component of a digital signal, a second frequency mixer circuit for modulating a signal according to the analog signal or the cosine wave component of a digital signal, the signal to be modulated being produced by shifting 90° a phase of the carrier, and an adder for adding a signal outputted from the first frequency mixer circuit to a signal outputted from the second frequency mixer circuit.

Thanks to the constitution in accordance with the present invention, the voltage/frequency converter and the integrating circuit can be dispensed with, which consequently leads to an advantage that the cost of the voltage/frequency converter is lowered and the circuit configuration thereof is simplified.

BRIEF DESCRIPTION OF THE DRAWINGS

The objects and features of the present invention will become more apparent from the consideration of the following detailed description taken in conjunction with the accompanying drawings in which:

FIG. 4 is a functional block diagram showing the configuration of a third embodiment of the digital and analog modulator in accordance with the present invention; and FIG. 5 is a schematic block diagram showing the construction of a portable telephone apparatus to which a digital and analog modulator of the present invention is applied.

DESCRIPTION OF THE PREFERRED EMBODIMENTS

Referring now to the accompanying drawings, description will be given in detail of embodiments of the present invention.

Figure 1:
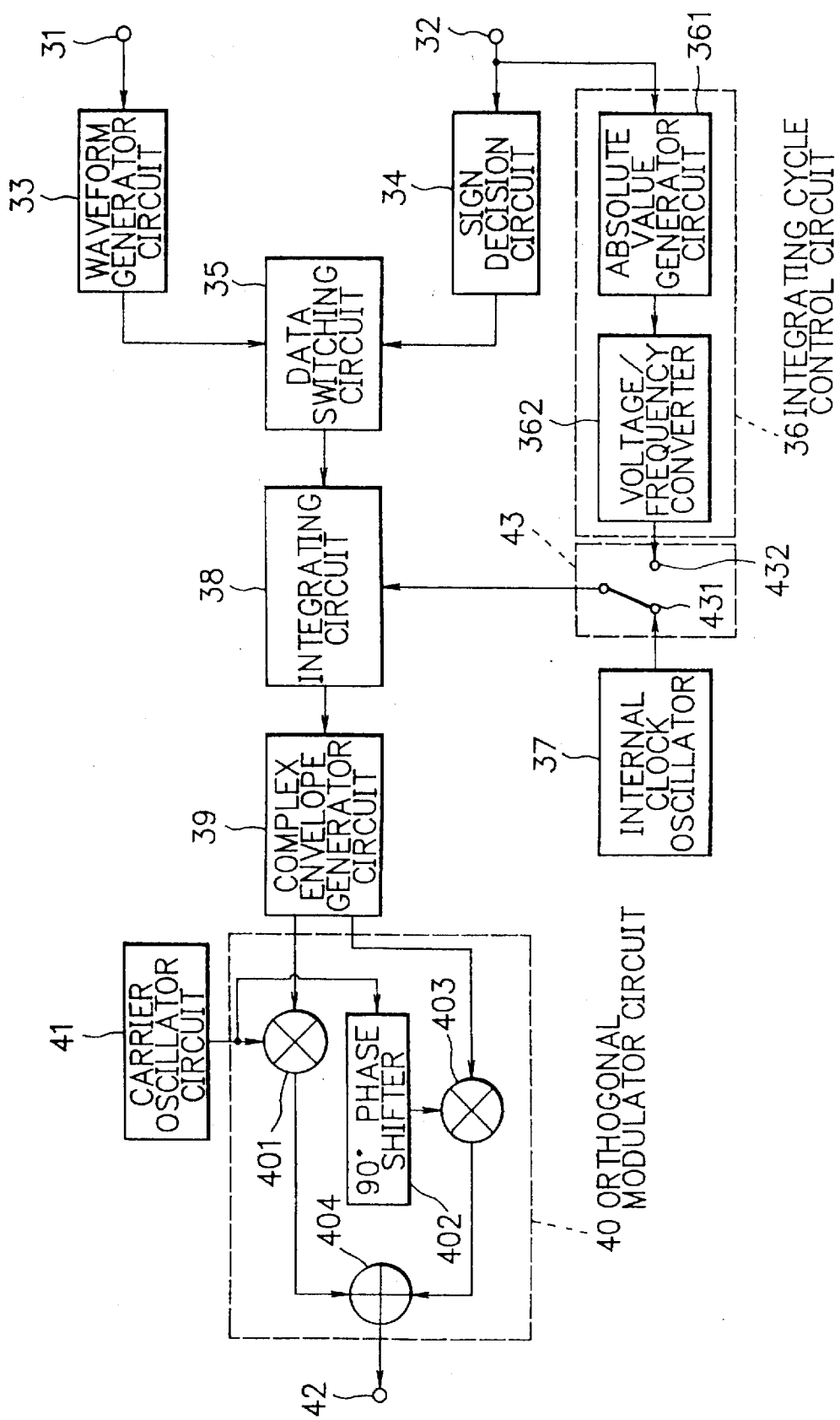
FIG. 1 is a functional block diagram showing the structure of a digital and analog modulator of the conventional technology.
Figure 2:
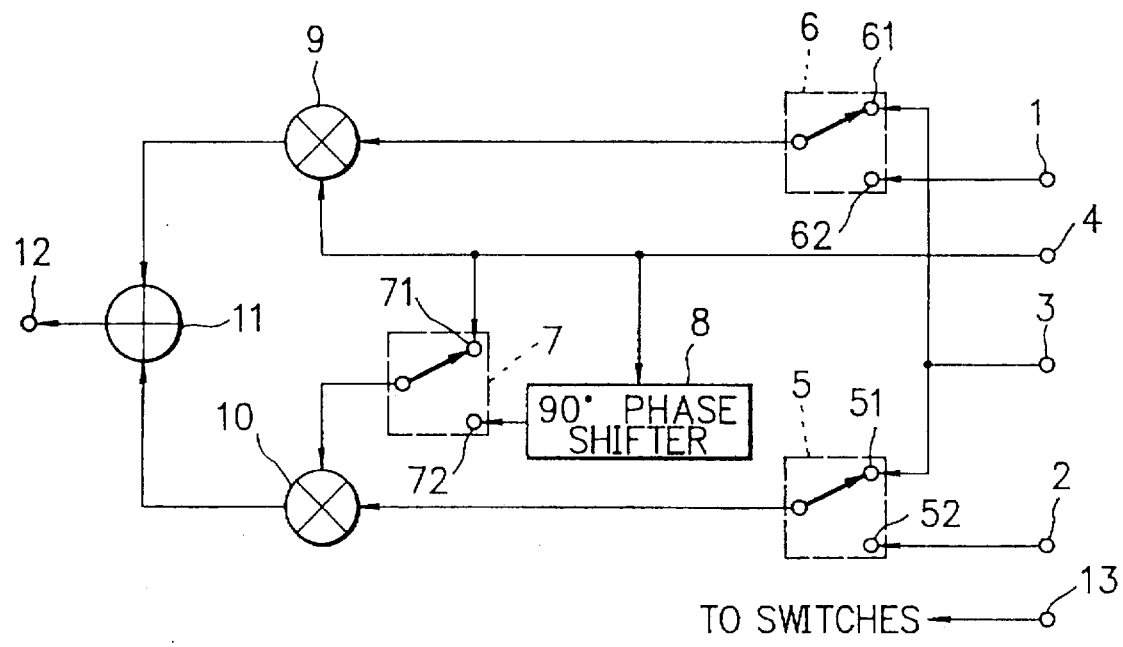
FIG. 2 is a functional block diagram schematically showing the configuration of a first embodiment of the digital and analog modulator in accordance with the present invention.

FIG. 2 shows in a functional block diagram a first embodiment of the digital and analog modulator (to be simply referred to as a modulator herebelow) in accordance with the present invention.

As shown in this diagram, the modulator includes an I signal input terminal 1 for receiving an an input signal a sine wave signal (to be referred to as an I signal herebelow) denoting a sine wave component of a digital signal, a Q signal input terminal 2 for receiving an an input signal a sine wave signal (to be referred to as an Q signal herebelow) representing a cosine wave component of the digital signal, an analog signal input terminal 3 for receiving an analog signal as an input thereto, a carrier wave input terminal 4 for receiving a carrier as an input thereto, and a control signal input terminal 13 for receiving as an input thereto a control signal to supervise a switching operation.

In addition, the modulator includes a switch unit 5 for conducting a switching operation between the Q and analog signals, a switch unit 6 for conducting a change-over operation between the I and analog signals, a frequency mixer circuit 9 for modulating a carrier according to the I or analog signal, a 90° phase shifter 8 for shifting 90° a phase of the carrier, a switch unit 7 for accomplishing a switching operation between the carrier and a signal obtained by shifting 90° a phase of the carrier, a frequency mixer circuit 10 for modulating the carrier or the signal having the shifted phase according to the Q or analog signal, an adder 11 for receiving signals outputted respectively from the mixers 9 and 10, adding the signals to each other, and producing a resultant modulated signal, and an output terminal 12 for outputting the modulated signal therefrom.

Subsequently, description will be given of operation of the modulator shown in FIG. 2.

When a digital signal is transmitted in the configuration of FIG. 2 (in a digital mode), the switches 5, 6, and 7 respectively select terminals 52, 62, and 72 in response to a control signal from the input terminal 13.

The I signal from the I signal input terminal 1 is transferred via the switch 6 to the frequency mixer 9. In the mixer 9, the carrier from the carrier wave input terminal 4 is modulated according to the I signal such that a modulated wave of the I signal is fed to the adder 11. The Q signal from the Q signal input terminal 2 is fed via the switch 5 to the frequency mixer 10, which receives from the phase shifter 8 a signal produced by shifting 90° the phase of the carrier from the carrier wave input terminal 4. In the mixer 10, the signal having the shifted phase is modulated according to the Q signal. A resultant modulated signal of the Q signal is outputted to the adder 11. In the adder 11, the modulated signals respectively of the I and Q signals are then added to each other such that a resultant modulated wave signal is delivered from the output terminal 12.

When transmitting an analog signal in the circuit of FIG. 2 (in an analog mode), the switches 5, 6, and 7 respectively chose terminals 51, 61, and 71 in response to a control signal from the control input signal terminal 13.

The analog signal from the analog signal input terminal 3 is transferred via the switches 5 and 6 to the frequency mixers 9 and 10, respectively. In the mixers 9 and 10, the carrier from the carrier wave input terminal 4 is modulated according to the analog signal such that respectively modulated waves of the analog signal are supplied to the adder 11. In the adder 11, the modulated signals are added to each other such that a resultant modulated wave signal having a frequency which is twice that of the original signal is delivered from the output terminal 12.

Figure 3:
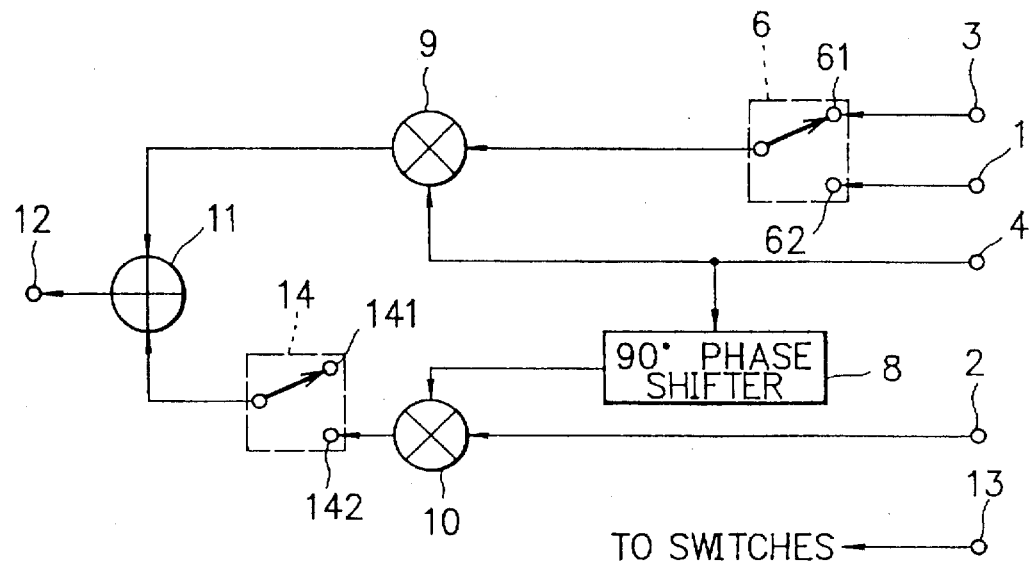
FIG. 3 is a circuit block diagram showing the configuration of a second embodiment of the digital and analog modulator in accordance with the present invention.

FIG. 3 is a functional block diagram showing a second embodiment of the digital and analog modulator in accordance with the present invention.

The configuration of the second embodiment of FIG. 3 is primarily the same as that of the first embodiment. Only the number of switch units is reduced to two in the second embodiment. In this regard, the same constituent components of the second embodiment as those of the first embodiment are assigned with the same reference numerals.

The modulator of FIG. 3 includes switches 6 and 14. While the switch includes terminals 61 an 62, the switch 14 includes terminals 141 and 142. The terminal 61 of switch 6 is connected an analog signal input terminal 3, whereas the terminal 62 is linked with the I signal input terminal 1. Furthermore, the terminal 141 of switch 14 is in an open state and the terminal 142 is coupled with an output terminal of the frequency mixer 10.

Next, description will be given of operation of the modulator shown in FIG. 3.

When the circuit system of FIG. 3 operates in the digital mode, the switches 6 and 14 respectively select the terminals 62 an 142 in response to a signal from the control signal input terminal 13.

The I signal from the I signal input terminal 1 is sent via the switch 6 to the frequency mixer 9. In the mixer 9, the carrier from the carrier wave input terminal 4 is modulated according to the I signal such that a modulated wave of the I signal is fed to the adder 11. Moreover, the Q signal from the Q signal input terminal 2 is delivered to the frequency mixer 10, which receives from the phase shifter 8 a signal produced by shifting 90° the phase of the carrier from the carrier wave input terminal 4. In the mixer 10, the signal having the shifted phase is modulated according to the Q signal so as to output a resultant modulated signal of the Q signal to the adder 11. In the adder 11, the modulated signals respectively of the I and Q signals are added to each other to produce a modulated wave signal. The modulated wave signal is then delivered from the output terminal 12.

When the modulator operates in the analog mode, the switches 5 and 14 respectively chose terminals 61 and 141.

The analog signal from the analog signal input terminal 3 is fed via the switch 6 to the frequency mixers 9. In the mixer 9, the carrier from the carrier wave input terminal 4 is modulated according to the analog signal to resultantly deliver a modulated wave signal of the analog signal to the adder 11. Since the switch unit 14 is kept open on the input side thereof, the modulated signal is transferred through the adder to be outputted from the output terminal 12.

FIG. 4 shows in a schematic block diagram a third embodiment in accordance with the present invention.

The structure of the third embodiment of FIG. 4 is almost the same as those of the first and second embodiments respectively shown in FIGS. 2 and 3. The third embodiment includes only one switch unit. In this connection, the same constituent components of the third embodiment as those of the first and second embodiments are assigned with the same reference numerals.

In FIG. 4, the modulator includes a switch circuit 6 having terminals 61 an 62. While the terminal 61 of switch 6 is connected the analog signal input terminal 3, the terminal 62 is coupled with the I signal input terminal 1. Additionally, the modulator includes a 90° phase modulator circuit 15 including a 90° phase shifter 8 and a modulating circuit 10. The circuit 10 terminates operation thereof in response to a termination signal, which will be described later.

Next, operation of the modulator of FIG. 4 will be described.

When the modulator of FIG. 4 operates in the digital mode, the switch 6 selects the terminal 6 in response to a signal from the control signal input terminal 13.

The I signal from the I signal input terminal 1 is delivered via the switch 6 to the frequency mixer 9. In the mixer 9, the carrier from the carrier wave input terminal 4 is modulated according to the I signal so as to resultantly deliver a modulated wave signal of the I signal to the adder 11. Moreover, the Q signal from the Q signal input terminal 2 is fed to the frequency mixer 10, which receives from the phase shifter 8 a signal generated by shifting 90° a phase of the carrier from the carrier wave input terminal 4. In the mixer 10, the signal having the shifted phase is modulated according to the Q signal such that a resultant modulated signal of the Q signal is supplied to the adder 11. In the adder 11, the modulated signals respectively of the I and Q signals are added to each other to create a modulated wave signal. The modulated wave signal is then delivered from the output terminal 12.

On the other hand, when the modulator carries out operation in the analog mode, the 90° phase shifter 15 stops its operation in response to the termination signal. The switch 6 chooses terminal 61 according to a control signal from the control signal input terminal 13.

The analog signal from the analog signal input terminal 3 is sent via the switch 6 to the frequency mixer 9. In the mixer 9, the carrier from the carrier wave input terminal 4 is modulated according to the analog signal such that a resultant modulated wave signal of the analog signal is fed to the adder 11. Since the phase shifter 15 is in an inoperative mode, the modulated signal is transmitted through the adder 11 to be outputted from the output terminal 12.

In the embodiments above, the switches 5 to 7 and 14 select their terminals in response to the control signal. The control signal is produced from a controller 18, which will be described later. The controller 18 preferentially selects a digital mode as described in the Dual Mode Mobile-Station Base-Station Competity Standard (IS-54). Namely, when the available frequencies become insufficient, the controller 18 supplies the modulator with a control signal to select the analog mode in response to an instruction from a base station.

Moreover, the change-over operation from the digital mode to the analog mode may be carried out by the user, not in response to the selection from the base station.

FIG. 5 shows in a functional block diagram a portable telephone apparatus (to be simply referred to as a telephone herebelow) to which a modulator of the present invention is applied.

The telephone of FIG. 5 includes a microphone 151, a speaker 16, a voice processing circuit 17, and a controller 18. Additionally included therein are a π/4 shift QPSK converter circuit 19, a frequency modulator (FM) circuit 20, a modulator 21 in accordance with the present invention, a power amplifier 22, a branching filter 23, and an antenna 24. Moreover, the telephone includes a frequency demodulator circuit 25, a π/4 shift QPSK demodulator 26, a switch unit 27, a synthesizer 28, a receiver circuit 29, and an operating section 30.

The operating section 30 is required when the digital and analog modes are changed over by the user. This section may be implemented, for example, by an external switch. The user operates the section 30 to select the digital or analog mode.

Additionally, the voice processing circuit 17 may include a digital signal processor and a voice coder-decoder (CODED), whereas the controller 18 possibly includes a microprocessor and a channel coder-decoder.

Operation of the portable telephone of FIG. 5 will be next described.

In a case in which the user selects the digital mode from the operating section 30, the controller 18 sends a control signal to the switch 27 and the modulator 21 of the present invention. Thereafter, when a voice of the user is inputted from the microphone 151, the voice is compressed by the voice processing circuit 17 such that a digital signal associated therewith is delivered via the control circuit 18 to the π/4 shift QPSK converter circuit 19. In the circuit 19, the digital signal is transformed into an I signal and a Q signal to be delivered to the modulator 21. In the modulator, the I and Q signals are orthogonally modulated 21 into a modulated signal, which is then outputted to the power amplifier 22. In this regard, the orthogonal modulation is accomplished with a carrier from the synthesizer 28, which produces a frequency specified by a frequency specifying signal from the controller 18. The resultant modulated wave signal is amplified in power by the power amplifier 22. The amplified signal is then transferred via the branching filter 23 to be outputted from the antenna 24.

In a signal receiving operation, a radio signal captured by the antenna 24 is sent via the branching filter 23 to the receiver section 29 to be amplified therein. The amplified signal is then converted into a signal having an intermediate frequency in response to a local oscillation signal from the synthesizer 28 to be fed to the switch unit 27. Incidentally, the local oscillation signal has a frequency designated by the frequency specifying signal from the controller 18. Since the switch 27 selects a terminal 272 according to the control signal from the controller 18, the intermediate frequency signal is fed to the π/4 shift QPSK demodulator 26 to be demodulated therein. As a result, a demodulated signal is supplied to the controller 18 to be delivered to the voice processing circuit 17. The signal is then transformed therethrough into a voice to be delivered to the speaker 16, thereby producing a sound.

Next, when the user selects the analog mode from the operating section 30, the controller 18 feeds a control signal to the switch 27 and the modulator 21 in accordance with the present invention. When a voice of the user is inputted via the microphone 151, the voice is compressed by the voice processing circuit 17 such that an analog signal associated therewith is delivered via the control circuit 18 to the modulator 20. In the circuit 20, the analog signal is transformed into a code to be delivered to the modulator 21. In the modulator 21, the analog signal is modulated with a carrier from the synthesizer 28, which produces a frequency specified by a frequency designating signal from the controller 18. The resultant modulated wave signal is amplified by the power amplifier 22 such that the amplified signal is fed through the branching filter 23 to be transmitted from the antenna 24.

In a signal reception mode, a radio signal received by the antenna 24 is transferred via the branching filter 23 to the receiver section 29 to be amplified therein. The amplified signal is transformed into a signal having an intermediate frequency in response to a local oscillation signal from the synthesizer 28 and is then fed to the switch unit 27. In this regard, the local oscillation signal has a frequency specified by the frequency specifying signal from the controller 18. Since the switch 27 selects a terminal 271 according to the control signal from the controller 18, the intermediate frequency signal is fed to the FM demodulator 26 to be demodulated therein. As a result, a demodulated signal is supplied to the controller 18 to be delivered therefrom to the voice processing circuit 18. The signal is then converted into a voice to be fed to the speaker 16, which resultantly produces a sound.

In the description of the above embodiment, the user operates the operating section to select the digital or analog mode. However, it may also be possible to receive a change-over signal from a base station such that the controller responsively creates a control signal for the change-over or termination of operation.

In the description of the embodiments above, the modulator in accordance with the present invention is applied to a telephone apparatus. However, it is to be appreciated that the embodiment does not restrict the present invention.

As described above, in the digital and analog modulator in accordance with the present invention, the voltage/frequency converter to produce a frequency in proportion to amplitude of an analog signal inputted thereto and the integrating circuit to generate instantaneous phase data of a digital or analog signal supplied thereto can be dispensed with. This advantageously simplifies the circuit construction of the modulator.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A digital and analog modulator, comprising:
    a first frequency mixer circuit for modulating a carrier according to one of an analog signal and a sine wave component of a digital signal;
    a second frequency mixer circuit for modulating an input signal according to one of the analog signal and a cosine wave component of said digital signal, the input signal to be modulated being produced by shifting by 90° a phase of the carrier; and
    an adder for adding a signal outputted from the first frequency mixer circuit to a signal outputted from the second frequency mixer circuit.

2. A digital and analog modulator in accordance with claim 1, the modulator being applied to a portable telephone apparatus in which the sine and cosine components are generated by modulating the digital signal through a π/4 shift QPSK modulation and the analog signal is created by modulating the analog signal through a frequency modulation.

3. A digital and analog modulator in accordance with claim 1, further including:
    a first input terminal for receiving as an input thereto the sine wave component of said digital signal;
    a second input terminal for receiving as an input thereto the cosine wave component of said digital signal;
    a third input terminal for receiving as an input thereto the carrier;
    a fourth input terminal for receiving as an input thereto the analog signal;
    a first switch having a first switch terminal connected to the first input terminal and a second switch terminal connected to the fourth input terminal for selecting either one of the first and second switch terminals in response to a control signal and outputting the input signal to the first frequency mixer circuit;
    a second switch having a third switch terminal connected to the second input terminal and a fourth switch terminal connected to the fourth input terminal for selecting either one of the third and fourth switch terminals in response to the control signal and outputting the input signal to the second frequency mixer circuit;
    a 90° phase shifter for shifting by 90° a phase of the carrier from the third input terminal; and
    a third switch having a fifth switch terminal connected to the third input terminal and a sixth switch terminal connected to an output terminal of the 90° phase shifter for selecting either one of the fifth and sixth switch terminals in response to the control signal.

4. A digital and analog modulator, comprising:
    a first input terminal for receiving as an input thereto a sine wave component of a digital signal;
    a second input terminal for receiving as an input thereto a cosine wave component of the digital signal;
    a third input terminal for receiving as an input thereto a carrier;
    a fourth input terminal for receiving as an input thereto an analog signal;
    a first switch having a first switch terminal connected to the first input terminal and a second switch terminal connected to the fourth input terminal for selecting either one of the first and second switch terminals in response to a control signal;
    a first frequency mixer circuit for modulating the carrier from the third input terminal according to an output signal from the first switch;
    a 90° phase shifter for shifting by 90° a phase of the carrier from the third input terminal;
    a second frequency mixer circuit for modulating a signal from the 90° phase shifter with the signal from the second input terminal;

a second switch having a third switch terminal connected to an output terminal of the second frequency mixer circuit and a fourth switch terminal in an open state for selecting either one of the third and fourth switch terminals in response to the control signal; and an adder for adding a signal outputted from the first frequency mixer circuit to a signal outputted from the second switch.

5. A digital and analog modulator, comprising:

a first input terminal for receiving as an input thereto a sine wave component of a digital signal;

a second input terminal for receiving as an input thereto a cosine wave component of said digital signal;

a third input terminal for receiving as an input thereto a carrier;

a fourth input terminal for receiving as an input thereto an analog signal;

a first switch having a first switch terminal connected to the first input terminal and a second switch terminal connected to the fourth input terminal for selecting either one of the first and second switch terminals in response to a control signal;

a first frequency mixer circuit for modulating the carrier from the third input terminal with an output signal from the first switch;

a 90° phase modulator including a 90° phase shifter for shifting by 90° a phase of the carrier from the third input terminal and a second frequency mixer circuit for modulating an output signal from the 90° phase shifter according to the cosine component of the digital signal from the second input terminal, the 90° phase modulator terminating operation in response to a termination signal; and an adder for adding a signal outputted from the first frequency mixer circuit to a signal outputted from the 90° phase modulator.

* * * * *